United States Patent
Suzuki et al.

(10) Patent No.: US 6,933,796 B2
(45) Date of Patent: Aug. 23, 2005

(54) VOLTAGE CONTROLLED OSCILLATING CIRCUIT

(75) Inventors: Satoshi Suzuki, Tokyo (JP); Takayuki Matsuzuka, Tokyo (JP); Kenichiro Choumei, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 119 days.

(21) Appl. No.: 10/687,752

(22) Filed: Oct. 20, 2003

(65) Prior Publication Data

US 2004/0155719 A1 Aug. 12, 2004

(30) Foreign Application Priority Data

Feb. 6, 2003 (JP) ........................................ 2003-029534

(51) Int. Cl.[7] .............................. H03B 5/12; H01L 29/93
(52) U.S. Cl. .............................. 331/177 V; 331/117 R; 257/595; 257/599
(58) Field of Search .......................... 331/36 C, 116 R, 331/116 FE, 117 R, 117 FE, 117 D, 177 V; 257/595, 598, 599, 600

(56) References Cited

U.S. PATENT DOCUMENTS

| | | | |
|---|---|---|---|
| 2,570,938 A | | 10/1951 | Goodrich, Jr. |
| 4,191,899 A | * | 3/1980 | Tomczak et al. .............. 326/92 |
| 4,303,894 A | | 12/1981 | Akazawa |
| 2002/0093377 A1 | | 7/2002 | Sakuno |

* cited by examiner

*Primary Examiner*—David Mis
(74) *Attorney, Agent, or Firm*—Leydig, Voit & Mayer, Ltd.

(57) ABSTRACT

A voltage controlled oscillating circuit operable to output a variable frequency, includes a variable capacitance element with the variable frequency varying with a variation in capacitance of the variable capacitance element. The variable capacitance element is provided by a bipolar transistor. The capacitance of the variable capacitance element is achieved by combining the capacitance by the PN junction between the emitter layer and the base layer and capacitance formed by the PN junction between the base layer and the collector layer in a bipolar transistor, and is controlled by a voltage applied between the emitter layer and the collector layer of the bipolar transistor.

5 Claims, 7 Drawing Sheets

VOLTAGE CONTROLLED OSCILLATING CIRCUIT

BACKGROUND OF THE INVENTION

1. Field of the Invention

The present invention relates to a voltage controlled oscillating circuit and more particularly, it relates to a voltage controlled oscillating circuit including a variable capacitance element having a bipolar transistor structure.

2. Related Art

A voltage controlled oscillating circuit is an oscillating circuit which can vary an output frequency according to a voltage applied. An example of a conventional voltage controlled circuit includes a transistor as an active element and a resonant circuit connected between the base and emitter of the transistor, and the resonant circuit comprises a variable capacitance element for varying an oscillation frequency.

The variable capacitance element can be implemented using a PN junction in a bipolar transistor, for example. In other words, it can be implemented by using a capacitance variation provided by applying a voltage to the PN junction between the base and the collector of the bipolar transistor. Japanese Patent Laid-Open Publication No. 2002-223127, corresponding to U.S. patent publication 2002/0093377 (see PP. 5, 9–10, FIGS. 6 and 9, etc.) discloses a power amplification circuit using a capacitive component of a PN junction in a bipolar transistor.

When an oscillation frequency is designed to be high in a voltage controlled oscillating circuit in which a variable capacitance element is implemented using such a bipolar transistor, the collector layer must be made thinner in order to increase the maximum oscillation frequency of the bipolar transistor. In order to obtain a sufficient capacitance when the collector layer is made thinner, a forward bias must be applied to the variable capacitance element using the PN junction between the base and the collector.

However, when the forward bias is applied to the PN junction between the base and the collector, a relatively large current flows, and thus current consumption is increased. Furthermore, because the current flows in the variable capacitance element, noise is generated and degrades the noise characteristic of the voltage controlled oscillating circuit.

SUMMARY OF THE INVENTION

The present invention was made to solve the above problems and it is an object of the present invention to provide a voltage controlled oscillating circuit which operates with a low consumption current and prevents a noise from being generated.

In a first aspect of the invention, provided is a voltage controlled oscillating circuit operable to output a variable frequency, including a variable capacitance element, the variable frequency varying with a variation in capacitance of the variable capacitance element. The variable capacitance element is provided by a bipolar transistor. The capacitance of the variable capacitance element is achieved by combining capacitance formed by a PN junction between an emitter layer and a base layer and capacitance formed by a PN junction between the base layer and a collector layer in a bipolar transistor, and is controlled by a voltage applied between the emitter layer and the collector layer of the bipolar transistor.

In a second aspect of the invention, provided is a voltage controlled oscillating circuit operable to output a variable frequency, including a variable capacitance element, the variable frequency varying with a variation in capacitance of the variable capacitance element. The variable capacitance element is provided by a bipolar transistor. The capacitance of the variable capacitance element is achieved by capacitance formed by a PN junction between a collector layer and a base layer in the bipolar transistor, and is controlled by a voltage applied between an emitter layer and the collector layer of the bipolar transistor.

According to the present invention, there can be provided a variable capacitance element in which current consumption is very small by using a bipolar transistor structure. Therefore, when the variable capacitance element is formed on the same substrate as the semiconductor substrate on which a bipolar transistor serving as an active element in an oscillating circuit is formed, there can be provided a voltage controlled oscillating circuit with low power consumption and a low noise.

DESCRIPTION OF THE PREFERRED EMBODIMENTS

Hereinafter, a description is made of preferred embodiments of a voltage controlled oscillating circuit according to the present invention in detail with reference to accompanying drawings.

First Embodiment

Figure 1:
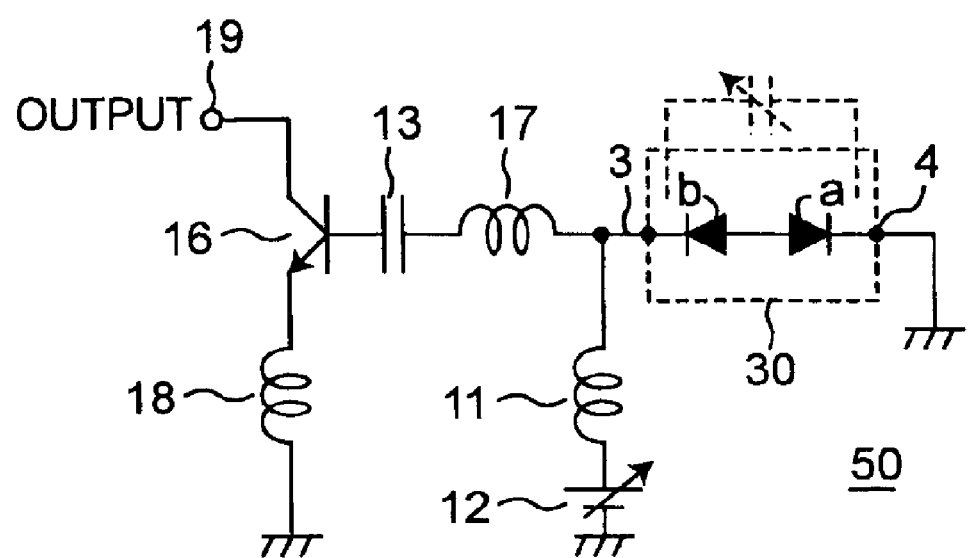
FIG. 1 is a configuration diagram of a voltage controlled oscillating circuit according to a first embodiment of the present invention.

FIG. 1 illustrates a configuration of a voltage controlled oscillating circuit according to the present invention. A voltage controlled oscillating circuit 50 includes inductors 11, 17 and 18, a capacitor 13, a control power supply 12, a bipolar transistor 16 and a variable capacitance element 30. The voltage controlled oscillating circuit 50 further includes an output terminal 19.

The inductor 17 and the variable capacitance element 30 constitute an LC resonant circuit. The capacitor 13 decouples a DC component of an output from the control power supply 12 from the bipolar transistor 16. The inductor 18 is a feedback inductor. The inductor 11 decouples an AC component from the control power supply 12. The control power supply 12 is a bias circuit for applying a voltage to the variable capacitance element 30 in order to vary capacitance of the variable capacitance element 30.

An oscillation frequency of the voltage controlled oscillating circuit 50 is mainly decided by a resonance frequency of the LC resonant circuit composed of the inductor 17 and the variable capacitance element 30. The resonance frequency varies with a variation in capacitance of the variable capacitance element 30. In other words, an output frequency of the voltage controlled oscillating circuit 50 can be varied by controlling the capacitance of the variable capacitance element 30.

The variable capacitance element 30 includes two diodes (a) and (b). These diodes (a) and (b) are reversely connected and provided by PN junctions in the bipolar transistor.

Figure 2A:
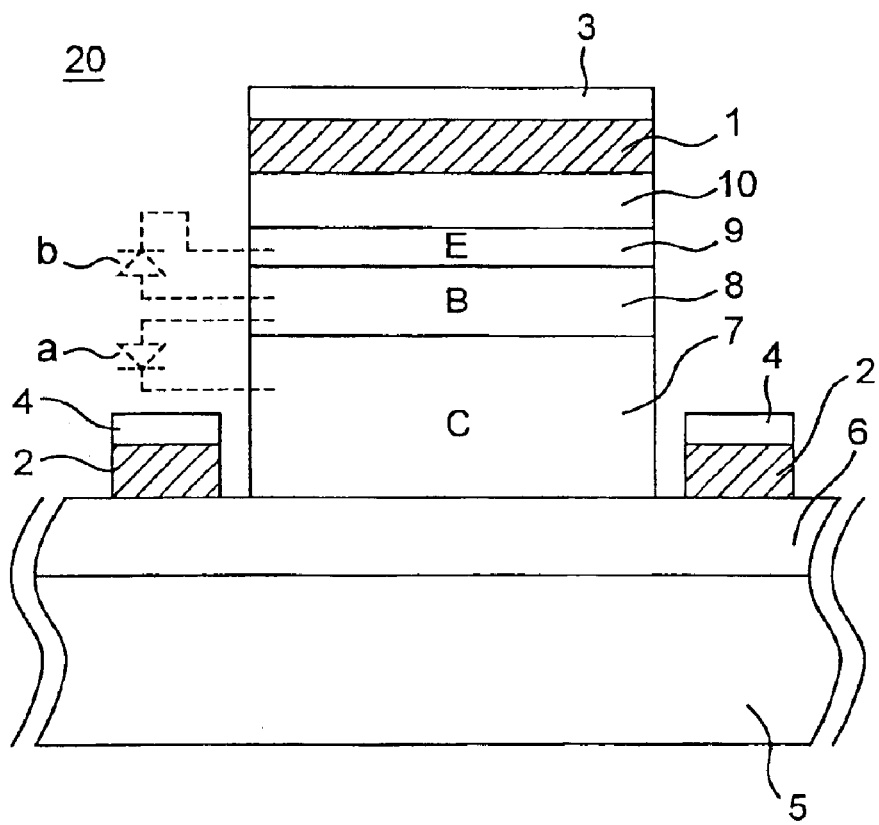
FIG. 2A is a cross sectional view showing a bipolar transistor constituting a variable capacitance element of the voltage controlled oscillating circuit according to the first embodiment.
Figure 2B:
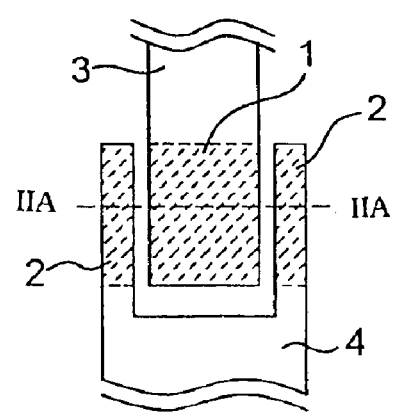
FIG. 2B is a top view showing the bipolar transistor constituting a variable capacitance element according to the first embodiment.

FIG. 2A illustrates a configuration of a bipolar transistor which provides the variable capacitance element 30. FIG. 2B illustrates the bipolar transistor 20 viewed from the above. It is noted that FIG. 2A is a cross sectional view taken along line IIA—IIA in FIG. 2B.

The bipolar transistor 20 shown in FIG. 2A contains an N$^+$-type collector contact layer 6, an N-type collector layer 7, a P-type base layer 8, an N-type emitter layer 9 and an N$^+$-type emitter contact layer 10 which are sequentially formed on a semi-insulating substrate 5.

A collector electrode 2 is formed on the N$^+$-type collector contact layer 6 and an emitter electrode 1 is formed on the N$^+$-type emitter contact layer 10. A collector wiring 4 and an emitter wiring 3 are connected to the collector electrode 2 and the emitter electrode 1, respectively.

The variable capacitance element 30 is achieved by using the diode (a) formed by a PN junction between the base layer 8 and the collector layer 7 of the bipolar transistor 20, and the diode (b) formed by a PN junction between the base layer 8 and the emitter layer 9 of the bipolar transistor 20. In other words, the capacitance of the variable capacitance element 30 is provided by combining a capacitive component of the diode (a) and a capacitive component of the diode (b).

Figure 4:
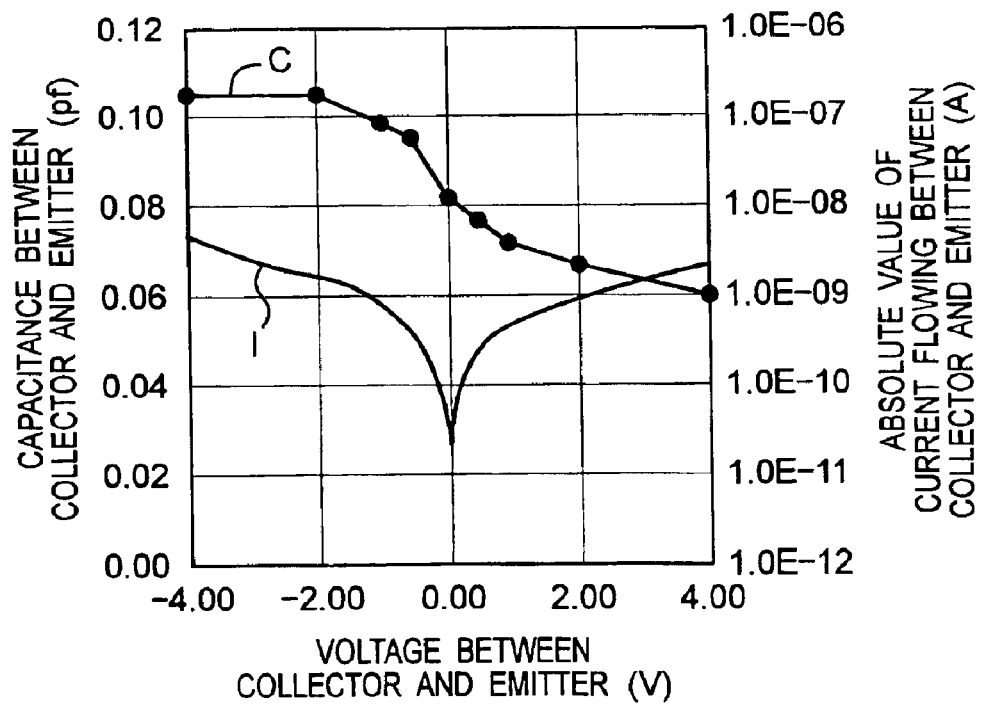
FIG. 4 is a graph showing variations of capacitance and a current between the collector and the emitter of the bipolar transistor constituting the variable capacitance element with respect to a voltage applied between the collector and the emitter, according to the first embodiment.

FIG. 4 illustrates a graph showing a capacitance variation (line C) between the collector and the emitter of the bipolar transistor 20 and a current variation (line I) flowing between the collector and the emitter with respect to a change in voltage applied to a part (that is, the variable capacitance element) between the collector and emitter. As shown in the figure, even when the voltage is applied to the part between the collector and the emitter, that is, the variable capacitance element 30, only a minute current flows. Meanwhile, the capacitance of the variable capacitance element 30 varies according to a voltage value applied between the emitter wiring 3 and the collector wiring 4 (see line C). Hereinafter, this is described in detail.

When a voltage is applied to the variable capacitance element 30, that is, the diodes (a) and (b) from the control power supply 12, only a minute current flows even when the voltage is applied between the emitter wiring 3 and the collector wiring 4, because the PN junction between the emitter layer 9 and the base layer 8 and the PN junction between the base layer 8 and the collector layer 7 are reversely connected and thus one of PN junctions is reversely biased. In addition, electron holes generated at the reversely biased PN junction are accumulated in the base layer 8, which is equivalent to a fact that a positive voltage is applied to the base layer 8, and a width of a depletion layer formed between the base layer 8 and the emitter layer 9 and a width of a depletion layer formed between the base layer 8 and the collector layer 7 are modulated, respectively. As a result, the capacitance between the emitter wiring 3 and the collector wiring 4 (that is, the capacitance of the variable capacitance element 30) varies.

Thus, according to the variable capacitance element of the present embodiment, the capacitance provided between the emitter and collector of the bipolar transistor is variable by controlling the voltage applied between the emitter and the collector.

Figure 3:
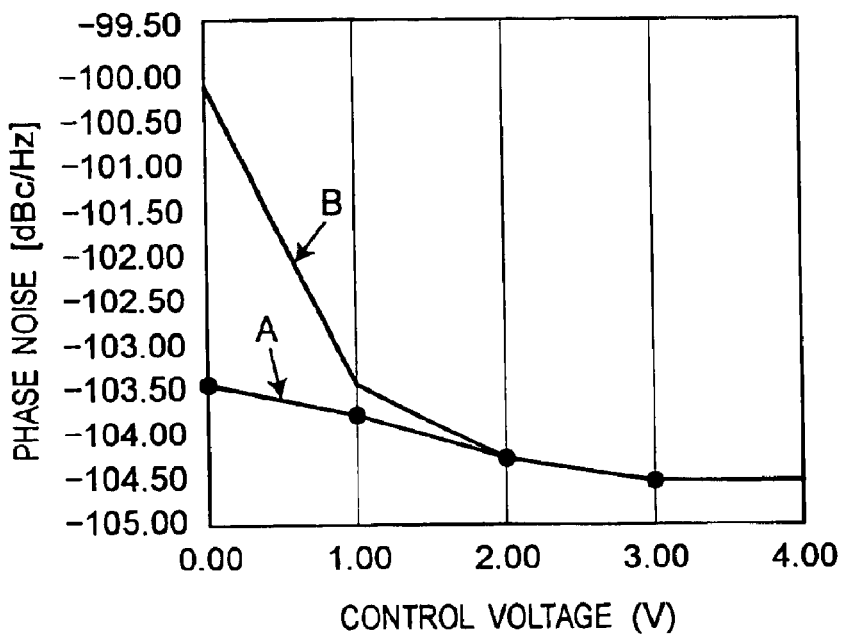
FIG. 3 is a graph showing a phase noise characteristic of the voltage controlled oscillating circuit.

As described above, the capacitance of the variable capacitance element 30 (that is, the capacitance provided between the emitter wiring 3 and the collector wiring 4) can be controlled by the voltage applied between the emitter wiring 3 and the collector wiring 4 from the control power supply 12. FIG. 3 is a graph showing a phase noise characteristic (A) of the voltage controlled oscillating circuit using the variable capacitance element 30 according to the present embodiment and a phase noise characteristic (B) of a conventional voltage controlled oscillating circuit using a variable capacitance element employing a capacitance variation provided by applying a voltage to a PN junction between a base and a collector. It can be seen from the graph that the phase noise characteristic of the voltage controlled oscillating circuit 50 according to the present embodiment is improved as compared with that of the conventional voltage controlled oscillating circuit. This is because a current hardly flows into the variable capacitance element 30 in the voltage controlled oscillating circuit 50 according to the present embodiment.

As described above, according to the present embodiment, there is provided a variable capacitance element in which a current consumption is reduced, using a bipolar transistor structure. When this variable capacitance element is formed on the same semiconductor substrate as that on which the bipolar transistor serving as an active element of an oscillating circuit is formed, there can be provided a voltage controlled oscillating circuit having a reduced power consumption and a low noise.

Second Embodiment

According to a variable capacitance element of a voltage controlled oscillating circuit of the present embodiment, capacitance appeared between the base and the collector of the bipolar transistor is varied by controlling a voltage applied between the emitter and the collector.

Figure 5:
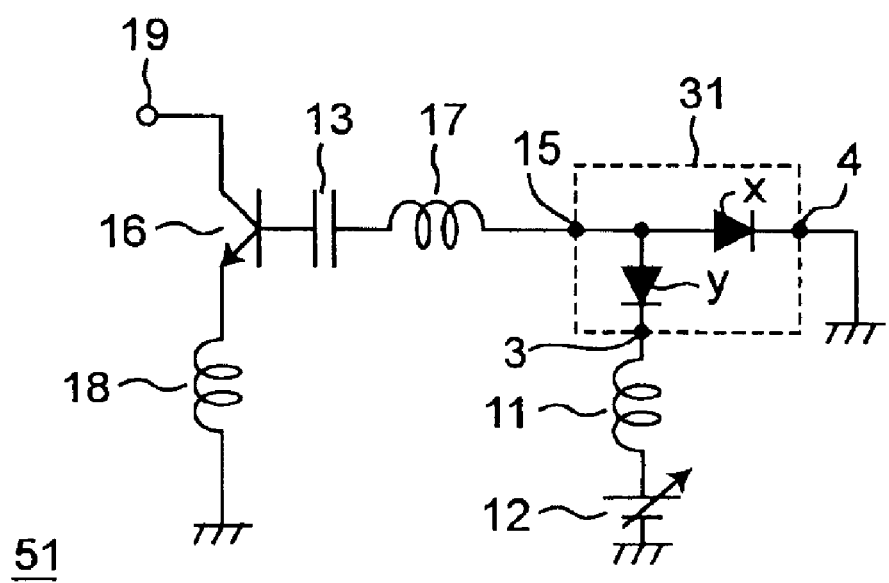
FIG. 5 is a configuration diagram of a voltage controlled oscillating circuit according to a second embodiment of the present invention.

FIG. 5 illustrates a configuration of the voltage controlled oscillating circuit according to the present embodiment. According to the present embodiment, a variable capacitance element 31 is composed of two diodes (x) and (y).

Figure 6A:
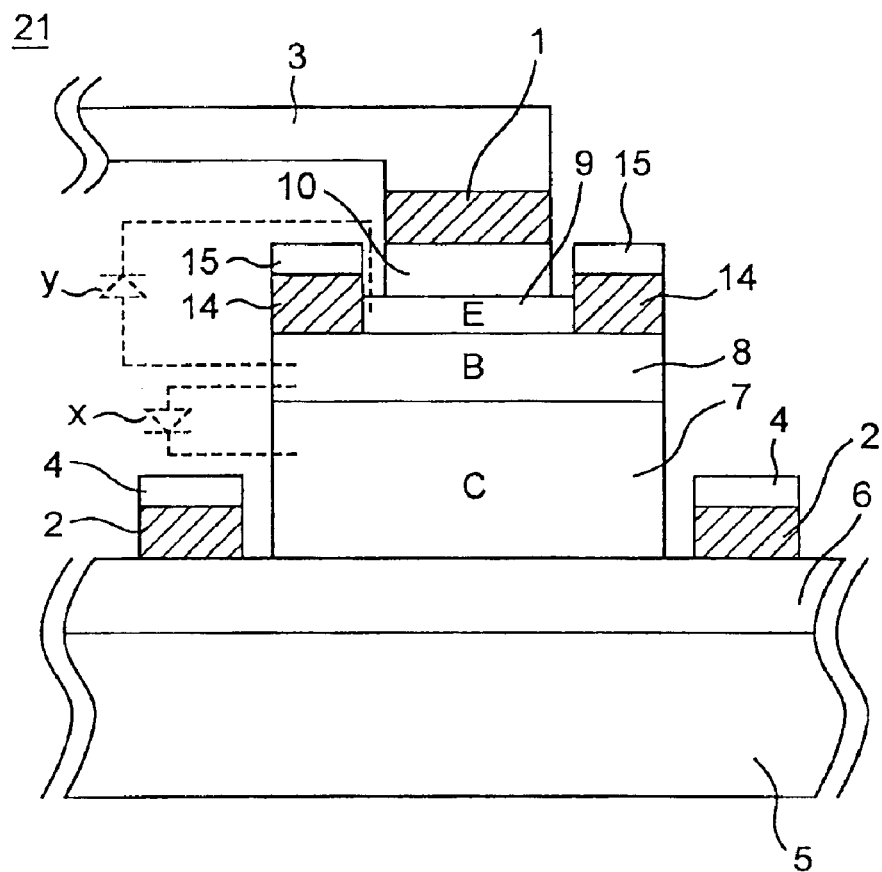
FIG. 6A is a cross sectional view showing a bipolar transistor constituting a variable capacitance element of the voltage controlled oscillating circuit according to the second embodiment.
Figure 6B:
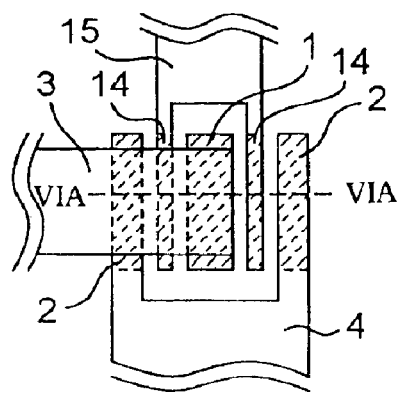
FIG. 6B is a top view showing the bipolar transistor constituting a variable capacitance element according to the second embodiment.

FIG. 6A is a cross sectional view showing a bipolar transistor 21 implementing the variable capacitance element 31. FIG. 6B illustrates the bipolar transistor 21 viewed from the above. FIG. 6A is a cross sectional view taken along line VIA—VIA in FIG. 6B.

As shown in FIG. 6A, although the constitution of the bipolar transistor 21 is basically the same as that of the bipolar transistor 20 according to the first embodiment, it is different from the first embodiment in that a base electrode 14 is provided on a P-type base layer 8 of the bipolar 21. A base wiring 15 is connected to the base electrode 14.

As shown in FIG. 5, the collector wiring 4 is grounded and the emitter wiring 3 is connected to a control power supply 12 through the inductor 11.

According to the present embodiment, an LC resonant circuit is formed of the inductor 17 and a capacitive component of the diode (x) of the variable capacitance element 31. In other words, the capacitive component of the diode (x) of the variable capacitance element 31 mainly contributes to a variation in capacitance of the whole variable capacitance element 31. The diode (x) is formed by a PN junction between the base and the collector of the bipolar transistor 21.

Figure 7:
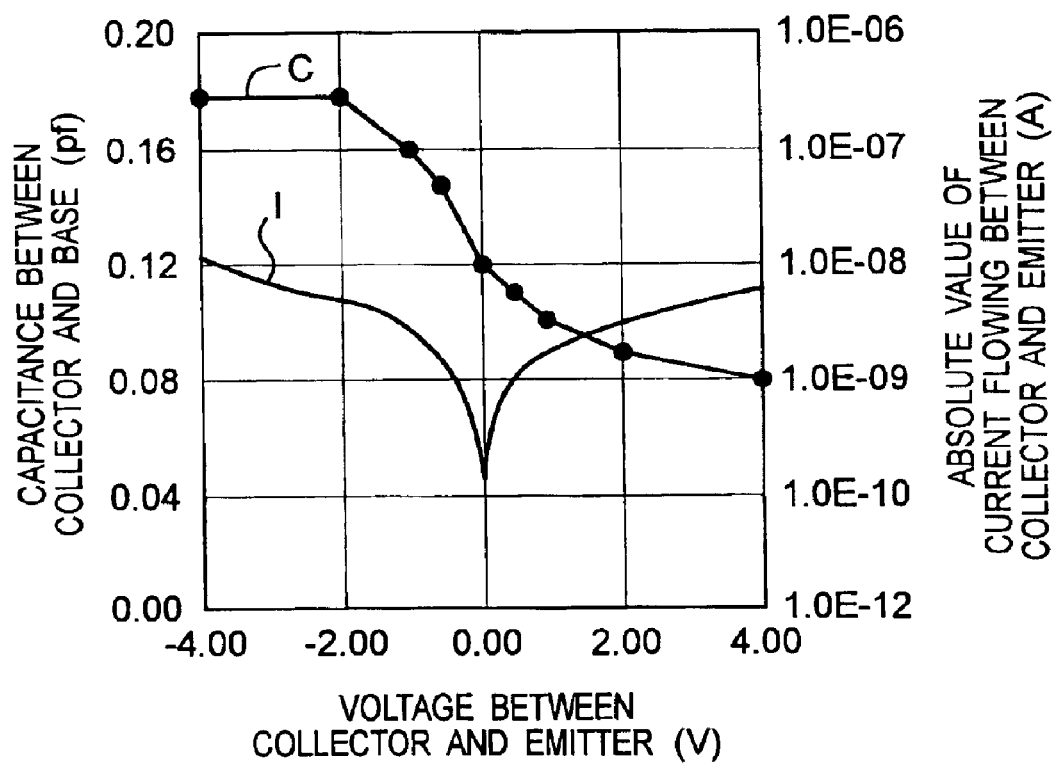
FIG. 7 is a graph showing variations of capacitance between the collector and the base and a current between the collector and the emitter of the bipolar transistor constituting the variable capacitance element with respect to a voltage applied between the collector and the emitter, according to the second embodiment.

FIG. 7 is a graph showing the capacitance variation (line C) between the collector and the base of the bipolar transistor 21 and a current variation (line I) flowing between the collector and the emitter with respect to a change in voltage applied between the collector and the emitter. As can be shown in the graph, when a voltage is applied to the variable capacitance element 31 from the control power supply 12, only a minute current flows between the emitter wiring 3 and the collector wiring 4 (see line I). Meanwhile, the capacitance between the collector wiring 4 and the base wiring 15 varies according to a voltage applied between the collector and the emitter (see line C). Hereinafter, this is described in detail.

As described in the first embodiment, since the PN junction forming the one diode (y) constituting the variable capacitance element 31 is reversely biased, only a minute current flows. Electron holes generated at the PN junction of the reversely biased diode (y) are accumulated in the base layer 8, which is equivalent to a fact that a positive voltage is applied to the base layer 8, and a width of a depletion layer formed between the base layer 8 and the collector layer 7 is modulated. As a result, the capacitance between the base wiring 15 and the collector wiring 4 (that is, the capacitance of the variable capacitance element 31) varies.

Thus, according to the present embodiment, like the first embodiment, there is provided a variable capacitance element capable of reducing a current consumption, using a bipolar transistor structure. When this variable capacitance element is formed on the same semiconductor substrate as that on which a bipolar transistor serving as an active element of an oscillating circuit is formed, there is provided a voltage controlled oscillating circuit capable of reducing power consumption and lowering a noise.

Third Embodiment

Figure 8A:
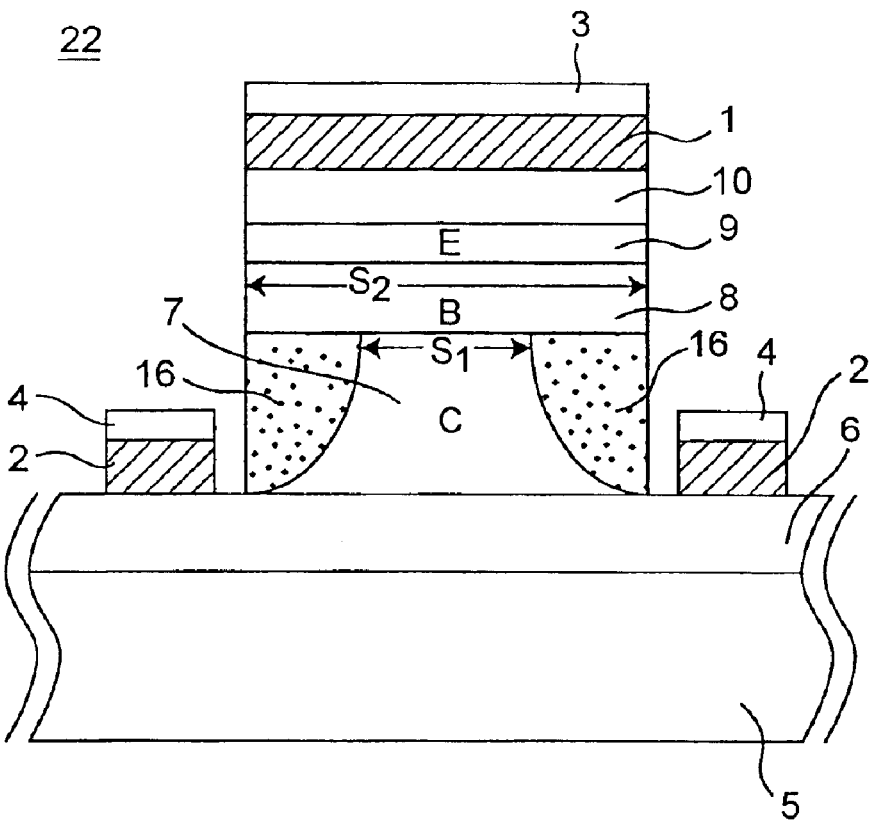
FIG. 8A is a cross sectional view showing a bipolar transistor constituting a variable capacitance element of the voltage controlled oscillating circuit according to the third embodiment.
Figure 8B:
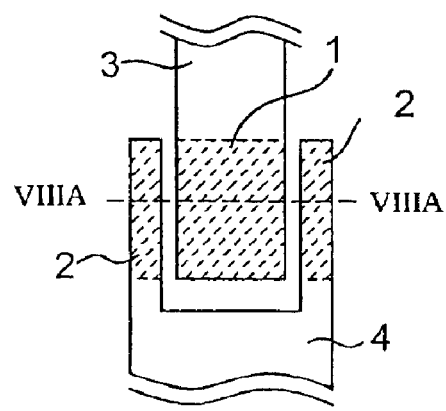
FIG. 8B is a top view showing the bipolar transistor constituting a variable capacitance element according to the third embodiment.

FIG. 8A illustrates another configuration of a bipolar transistor constituting a variable capacitance element. FIG. 8B illustrates the bipolar transistor 22 viewed from the above. FIG. 8A is a cross sectional view taken along line VIIIA—VIIIA in FIG. 8B. According to the present embodiment, in order to increase a variation range of the capacitance between the emitter and the collector of the variable capacitance element of the first embodiment, a junction area ($S_2$) of a PN junction between the emitter and the base is made larger than a junction area ($S_1$) of a PN junction between the base and the collector.

A region 16 which is insulated by ion implantation is formed in the collector layer 7 of the bipolar transistor 22. It can be insulated by the ion implantation since the collector layer 7 normally has an impurity concentration lower than those of the other layers by single to double digits. Therefore, insulating the region 16 which is a part of the collector layer 7 by the ion implantation decreases relatively the junction area ($S_1$) of the PN junction between the base and the collector.

When the junction area ($S_1$) of the PN junction between the base and the collector is decreased, capacitance of the PN junction between the base and the collector is decreased and capacitance of the PN junction between the emitter and the base is relatively increased. As a result, a variation of the capacitance appeared between the emitter and the collector increases. More specifically, there can be provided a variable capacitance element having a capacitance variation larger than that of the variable capacitance element of the voltage controlled oscillating circuit described in the first embodiment, and there can be provided a voltage controlled oscillating circuit having a larger frequency band.

Although there has been shown the configuration of the serial feedback-type oscillating circuit in which the variable capacitance element is connected to the base terminal of the bipolar transistor in the above-described embodiments, the variable capacitance element may be connected in series to a collector terminal or an emitter terminal of the bipolar transistor 16. In addition, the variable capacitance element may be applied to a parallel feedback-type oscillating circuit. In this case, the variable capacitance element is connected between two terminals among the collector, base and emitter terminals of the bipolar transistor. Furthermore, resistance can be used instead of the inductor in order to isolate the AC component from the control power supply.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application No. 2003-29534, filed on Feb. 6, 2003, which is expressly incorporated herein by reference in its entirety.

What is claimed is:

1. A voltage controlled oscillating circuit operable to output a variable frequency, comprising a variable capacitance element, the variable frequency varying with a variation in capacitance of the variable capacitance element, wherein the variable capacitance element is provided by a bipolar transistor, having emitter, base, and collector layers, the capacitance of the variable capacitance element being achieved by combining a capacitance formed by a PN junction between the emitter layer and the base layer and a capacitance formed by a PN junction between the base layer and the collector layer of the bipolar transistor, and is controlled by a voltage applied between the emitter layer and the collector layer of the bipolar transistor.

2. The voltage controlled oscillating circuit according to claim 1, wherein a junction area between the emitter layer and the base layer is larger than junction area between the emitter layer and the collector layer.

3. The voltage controlled oscillating circuit according to claim 1, further comprising a bias circuit which applies a voltage, for controlling the capacitance, to the emitter layer.

4. A voltage controlled oscillating circuit operable to output a variable frequency, comprising a variable capacitance element, the variable frequency varying with a variation in capacitance of the variable capacitance element, wherein the variable capacitance element is provided by a bipolar transistor, having emitter, base, and collector layers, the capacitance of the variable capacitance element being achieved by a capacitance formed by a PN junction between the collector layer and the base layer of the bipolar transistor, and is controlled by a voltage applied between the emitter layer and the collector layer of the bipolar transistor.

5. The voltage controlled oscillating circuit according to claim 4, further comprising a bias circuit which applies a voltage, for controlling the capacitance, to the emitter layer.

* * * * *